United States Patent [19]

Miyasaka

[11] Patent Number: 4,468,116

[45] Date of Patent: Aug. 28, 1984

[54] PROCESS CAMERA FOR PRINTING PICTURES OF DIFFERENT SIZES IN THE DESIRED DISPLAY POSITIONS

[75] Inventor: Eiji Miyasaka, Hikone, Japan

[73] Assignee: Dainippon Screen Seizo Kabushiki Kaisha, Kyoto, Japan

[21] Appl. No.: 376,005

[22] Filed: May 7, 1982

[30] Foreign Application Priority Data

Jul. 2, 1981 [JP] Japan .................. 56-102284

[51] Int. Cl.³ ............................................. G03B 17/20
[52] U.S. Cl. ........................................ 355/54; 355/75
[58] Field of Search ............... 355/54, 39, 53, 75, 355/76

[56] References Cited

U.S. PATENT DOCUMENTS

| | | | |
|---|---|---|---|
| 4,123,157 | 10/1978 | Klose et al. | 355/54 X |
| 4,225,223 | 9/1980 | Papadakis | 355/54 |
| 4,231,659 | 11/1980 | Logan | 355/54 X |
| 4,372,677 | 2/1983 | Horner | 355/54 X |
| 4,382,676 | 5/1983 | Ohta et al. | 355/54 X |

Primary Examiner—Richard A. Wintercorn
Attorney, Agent, or Firm—Poms, Smith, Lande and Rose

[57] ABSTRACT

A process camera for printing pictures of different sizes in the desired display positions on a photosensitive material to obtain a press plate, wherein a manuscript holder for mounting a manuscript to be printed, a lens holder including a focusing lens, and a photosensitive material holder for mounting a photosensitive material are aligned in series on and along the light axis, the manuscript holder being movable towards and away from the lens holder, and the photosensitive material holder being movable in the perpendicular directions to the light axis, and wherein a plurality of register pins and respective drive means for positioning the manuscripts of different sizes are provided in the manuscript holder, and each of the register pins is independently projected beyond the manuscript holder by the respective drive means.

4 Claims, 9 Drawing Figures

PROCESS CAMERA FOR PRINTING PICTURES OF DIFFERENT SIZES IN THE DESIRED DISPLAY POSITIONS

BACKGROUND OF THE INVENTION

The present invention relates to a process camera for printing pictures of different sizes in the desired display positions on a photosensitive material to obtain a press plate.

Usually, when a book is made by bookbinding, a plurality of pages are printed in both surfaces of a large printing paper, and thus the printing paper is folded to prepare one "section" which usually includes an octavo 16 pages and is the minimum unit for bookbinding. A plurality of sections are binded together to produce a book. The number and arrangement of the pages to be printed on the printing paper depend on the plate sizes, the size of the printing paper, the type and the size of the printer, the printing style, and so forth.

In FIGS. 1 and 2 there are shown both surfaces of an octavo 16 pages of one section of the printed paper 1 wherein a signature or a nigger head 2 and register marks 3 are attached, and wherein page numbers such as 1p–16p and photographing numbers I–VIII, hereinafter mentioned, are shown. The printed paper 1 is obtained in a conventional manner as follows:

(i) Each of the pages is photographed one by one on the film to produce negative plates for one section of one printing paper, and thus the obtained negative plates for the one section are arranged on a base film in the desired positions (for example, as shown in FIGS. 1 and 2). Then, the negative plates arranged on the base film are printed on a photosensitive material by exposing the light thereon, thereby obtaining a press plate.

(ii) The pages for one section of one printing paper are arranged on a base sheet in the desired positions, and the pages arranged on the base sheet are photographed on a film to obtain a large negative plate. Then, the large negative plate is printed on a photosensitive material, thereby obtaining a press plate.

(iii) Each of the pages is photographed one by one on a microfilm in the reduced scale, in advance, and then the necessary pages for the one section of the printing paper are automatically picked up and are projected to a photosensitive material in the desired display positions, thereby obtaining a press plate.

The method (i) is mostly carried out, but this method is performed manually in the most steps. Accordingly, it takes a lot of time and labors and an operational mistake is apt to be happened.

The method (ii) is often practiced and the time and the labors are considerably saved. However, the display of the pages on the base sheet is carried out manually, and hence a mistake is liable to arise. Further, since the pages displayed on the base sheet for one section is photographed altogether by one operation, a large process camera is required.

The method (iii) is effective for saving the labors and materials. However, the reducing and the enlarging photographing steps by optical systems are involved, and thus the quality of the reproduction image is lowered. Further, a costly apparatus is required. Accordingly, this method is less practiced now.

In order to remove these disadvantages of the conventional methods, another process camera has been proposed, as disclosed in Japanese patent application No. 55-153427.

However, in this embodiment, when the page is photographed upside-down with respect to the printing paper, a picture holder having a pair of register pins for positioning the page is rotated through 180 degree. Hence, the construction of the picture holder is complicated and costly, and the rotation of the picture holder requires more time than usual.

SUMMARY OF THE INVENTION

It is an object of the present invention to provide a process camera for printing pictures of different sizes in the desired display positions on a photosensitive material free from the aforementioned disadvantages and inconveniences, which is compact, simple and low-priced, and which is capable of performing a quick, simple and reliable operation.

According to the present invention there is provided a process camera for printing pictures of different sizes in the desired display positions on a photosensitive material, comprising (a) an object holder on which an object to be photographed is mounted and which includes a light for illuminating the object, (b) a photosensitive material holder on which a photosensitive material is mounted, (c) a lens holder for holding a lens which focuses the object onto the photosensitive material, wherein these three holders are aligned in series on and along a light axis of the lens, wherein the lens holder is positioned between the object holder and the photosensitive material holder, wherein the object holder is movable towards and away from the lens holder, and wherein the photosensitive material holder is movable in x and y directions perpendicular to the light axis, and (d) a plurality of register pins and respective drive means for positioning the objects of different sizes, which are mounted to the object holder so that each of the register pins may be independently projected through or beyond the object holder by the respective drive means.

BRIEF DESCRIPTION OF DRAWINGS

In order that the present invention may be better understood, a preferred embodiment thereof will be described with reference to the accompanying drawings, in which.

DESCRIPTION OF THE PREFERRED EMBODIMENT

Figure 3:
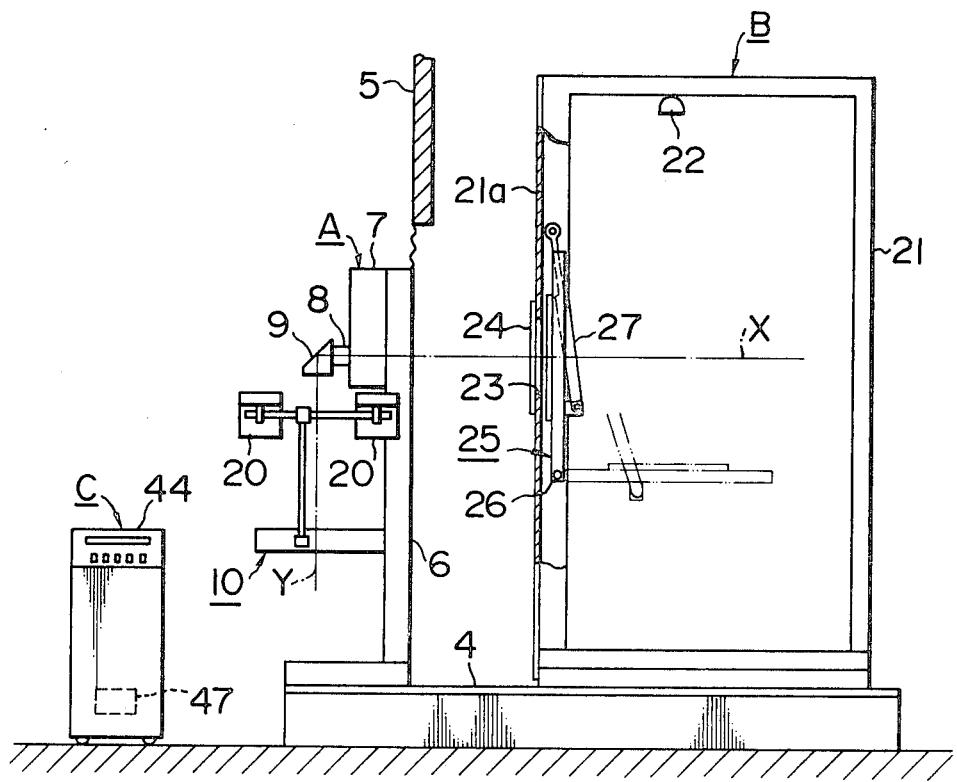
FIG. 3 is a side view of a process camera according to the present invention.

Referring to the drawings there is shown in FIG. 3 a process camera according to the present invention, which comprises a photographing section A mounted to the front of a base 4, a photosensitive material holding section B mounted movably front- and rearwards to the base 4, and a control section C positioned in front of the base 4. The photosensitive material holding section B is light-shielded by the photographing section A and a dark box 5.

In the photographing section A, a standframe 6 is arranged upright in the front part of the base 4, and a lens holder 7 is mounted to the upper front of the standframe 6. A lens 8 is detachably mounted to the front of the lens holder 7. A plane mirror 9 inclining at 45 degree is detachably mounted to the central front of the lens 8.

Figure 4:
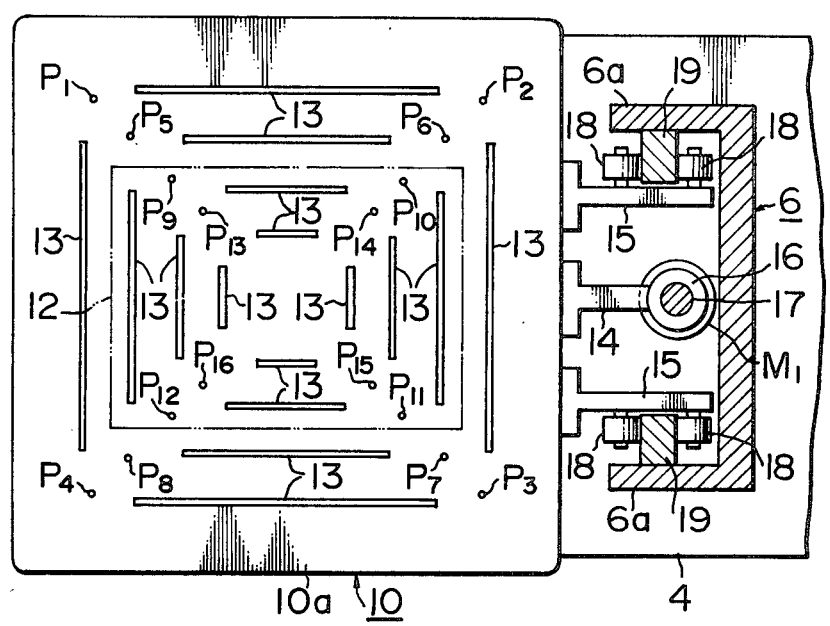
FIG. 4 is top plan view of a manuscript holder shown in FIG. 3.
Figure 5:
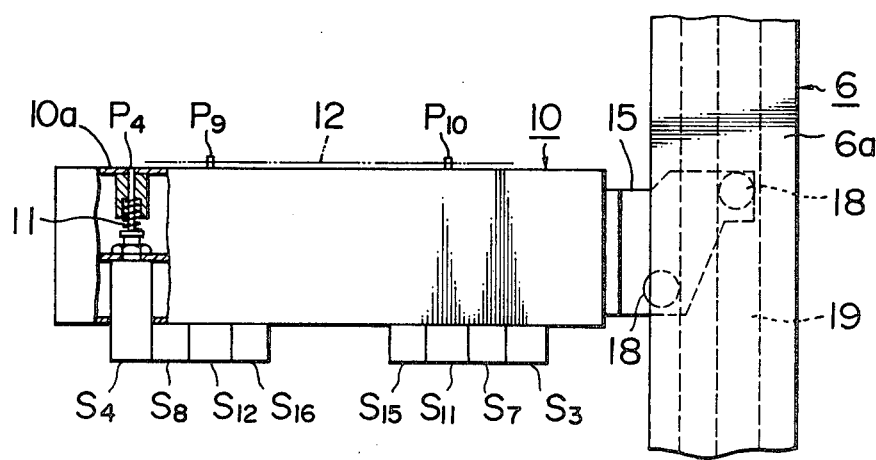
FIG. 5 is a side view of FIG. 4.

A manuscript holder 10 having a square form, as shown in FIGS. 4 and 5, is movably mounted to the standframe 6 under the lens holder 7 and is movable up and down. A plurality of register pins $P_1-P_4$, $P_5-P_8$, $P_9-P_{12}$, and $P_{13}-P_{16}$ are so mounted to the manuscript holder 10 that they may be positioned in vertices of squares formed thereby and thus on diagonals of an upper plate 10a of the manuscript holder 10 and that they may be projected upwards beyond the upper plate 10a means of solenoids or air cylinders $S_1-S_{16}$ arranged under the respective register pins.

Each register pin is biased downwards below the upper surface of the upper plate 10a by a coil spring 11 which is fitted around the register pin and is positioned between the upper plate 10a and the respective solenoid. When the solenoids $S_1-S_{16}$ are activated, the tops of the respective register pins $P_1-P_{16}$ are projected at a certain length beyond the upper plate 10a. When the solenoids $S_1-S_{16}$ are deactivated, the register pins $P_1-P_{16}$ are retracted in the manuscript holder 10.

The positions of the register pins $P_1-P_{16}$ are determined so that various sizes of manuscripts 12 may be mounted in the center of the manuscript holder 10 while the manuscripts 12 direct upwards, downwards, leftwards or rightwards in FIG. 4. For example, when the register pins $P_9$ and $P_{10}$ are projected by actuating the respective solenoids $S_9$ and $S_{10}$, the manuscript 12 can be placed in the center of the manuscript holder 10 by fitting holes formed in the left side of the manuscript 12 onto the register pins $P_9$ and $P_{10}$, as shown by a two-dotted line.

The upper plate 10a is provided with suction grooves 13 for different sizes of the manuscript to be mounted to the upper plate 10a, which are led to a suction means (not shown). A bracket 14 and a pair of other brackets 15 are mounted to the rear end of the manuscript holder 10 in its center and side parts, in parallel.

A nut 16 horizontally attached to the rear free end of the central bracket 14, is engaged with a vertical screw rod 17 which is rotatably mounted to the central front part of the standframe 6. The standframe 6 is provided with a pair of front projection members 6a in its right and left ends along its entire vertical length. A pair of rails 19 are mounted to the opposite inner surfaces of the front projection members 6a along their entire vertical lengths. A pair of guide rollers 18 are rotatably mounted to the outer side of each side bracket 15 in contact with the front and the rear surfaces of each rail 19. Hence, the vertical rod 17 is rotated by a drive motor $M_1$ mounted to the base 4, thereby moving up and down the manuscript holder 10 along the standframe 6.

Reflective illumination lights sources 20 are mounted to the manuscript holder 10 via support rods.

The photosensitive material holding section B comprises a frame 21 which are movably mounted to the base 4 and is moved front- and rearwards. A flash lamp 22 is hung on the inner central upper top of the frame 21, and a mask 24 is disposed to the front of a window opening 23 formed in the center of a front plate 21a of the frame 21, and is detachable.

Means 25 for holding a photosensitive material 48 is pivotally mounted to the lower front part of the frame 21 via a horizontal pivot shaft 26 which is pivotally connected to the base end of the means 25. An air cylinder 27 connects the middle part of the means 25 and the upper part of the front plate 21a. Thus, the means 25 is pivoted between the horizontal position shown by two-dotted lines and the vertical position for the photographing by extending and retracting the air cylinder 27, as shown in FIG. 3.

Figure 6:
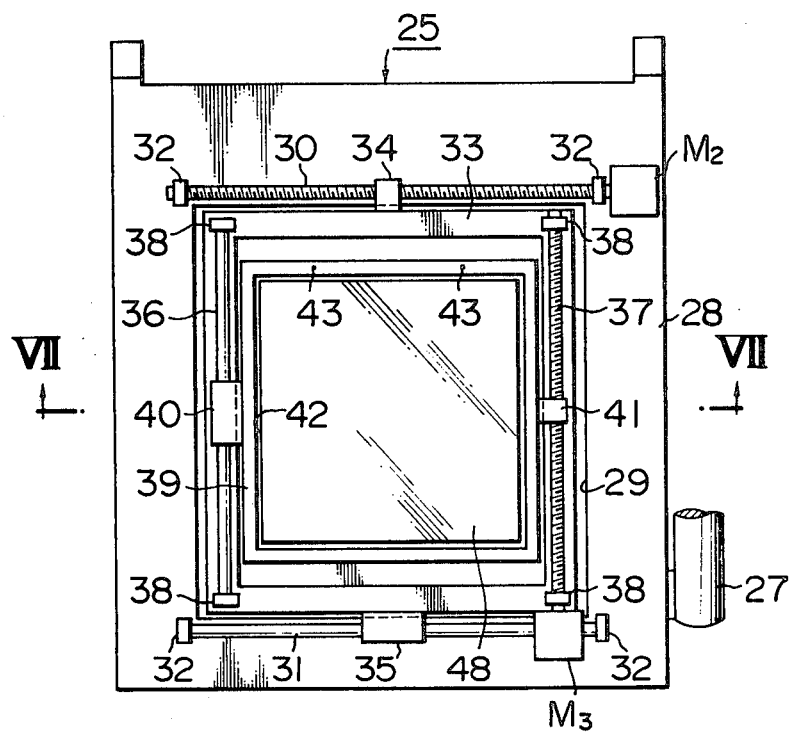
FIG. 6 is an elevational view of means for holding a photosensitive material of FIG. 3.
Figure 7:
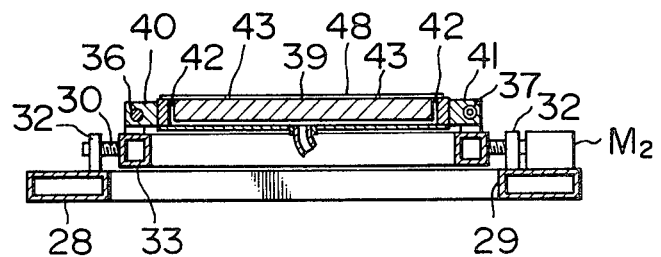
FIG. 7 is a longitudinal cross section, taken along the line VII—VII of FIG. 6.

In FIGS. 6 and 7, there is shown the means 25 for holding the photosensitive material 48. A base frame 28 of the means 25 is provided with a central square opening 29 in its center. A screw rod 30 and a guide rod 31 are rotatably mounted to the inner parts of the base frame 28 by bearings 32 in parallel with the opposite sides of the central square opening 29, as shown in the upper and the lower parts of FIG. 6. A drive motor $M_2$ is connected to one end of the screw rod 30 and is mounted to the base frame 28.

A movable frame 33 having approximately the same size as the central square opening 29 of the base frame 28 is provided with a nut 34 and a guide pipe 35 in its opposite sides of the periphery, which engage with the screw rod 30 and the guide rod 31, respectively (see FIG. 6).

A guide rod 36 and a screw rod 37 are rotatably mounted, in parallel, to the opposite sides of the movable frame 33 by bearings 38, and extends in the direction perpendicular to the screw rod 30 and the guide rod 31. A drive motor $M_3$ is connected to one end of the screw rod 37 in order to drive it.

A photosensitive material holder 39 having a square form and approximately the same dimension as the inner opening of the movable frame 33 is provided with a guide pipe 40 and a nut 41 in its opposite sides of the periphery, which engage with the guide rod 36 and the screw rod 37, respectively. The photosensitive material holder 39 is also provided with suction grooves 42 on its surface and a pair of register pins 43 in its one side for positioning the photosensitive material 48.

Thus the constructed photosensitive material holder 39 can be moved upwards, downwards, rightwards and leftwards in FIG. 6 by the drive motors $M_2$ and $M_3$.

The control section C is connected to the process camera described above via a leading wire (not shown), and comprises an operational board 44, a central processing unit 45, hereinafter referred to as CPU, an interface 46, a motor drive unit 47, a display (not shown), and so forth.

Figure 8:
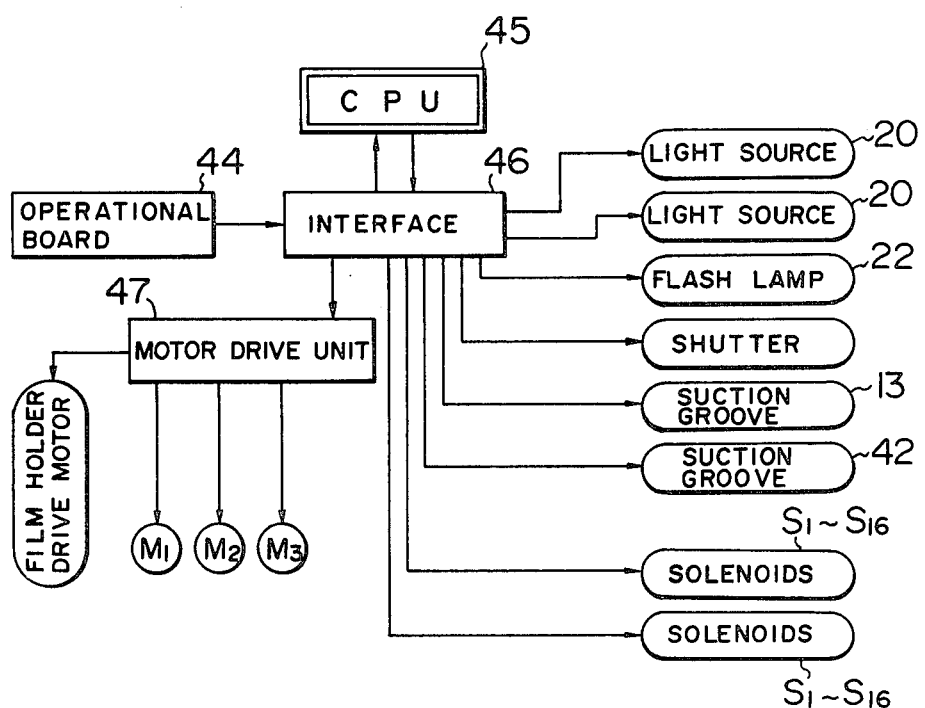
FIG. 8 is a block diagram of a control system of the process camera according to the present invention.
Figure 9:
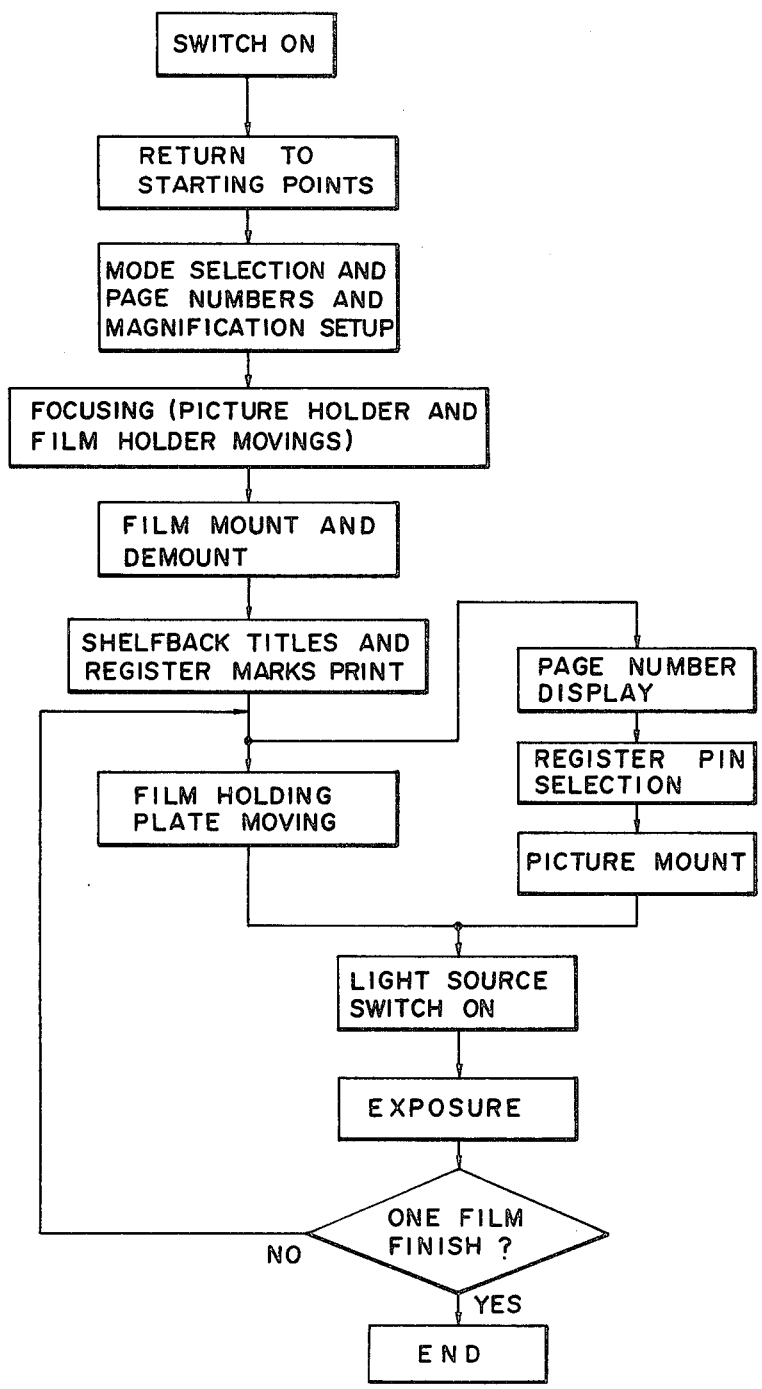
FIG. 9 shows a flow chart for operating the process camera according to the present invention.

The operation of the process camera of the present invention described above in order to produce the printed paper 1 shown in FIGS. 1 and 2, will be described with reference to FIGS. 8 and 9.

In the CPU 45 of the control section C, the sizes of the printing papers, the types and dimensions of the printers, and various modes relating to the numbers of the manuscripts to be printed for one section of the printing paper and their display positions are stored, in advance. One of these modes is selected freely by operating the operational board 44.

First, a power switch is turned on, and the CPU 45 drives the motor drive unit 47 via the interface 46, with the result that a motor for driving the photosensitive material holding section B and the three drive motors $M_1$, $M_2$ and $M_3$ are drive in order to return the photosensitive material holding section B, the manuscript holder 10 and the photosensitive material holder 39 to their starting points, and deactivates all the solenoids $S_1$-$S_{16}$ of the manuscript holder 10, resulting in retraction of the register pins $P_1$-$P_{16}$ within the manuscript holder 10.

Then, a photographing magnification which is determined depending on the number of the manuscripts for one section of the printing paper, photographing order, the size of the book-binding, and the sizes of the manuscripts, is set up in the operational board 44, and an automatic focusing means of a conventional type (not shown) is driven by operating a button of the operational board 44 to focus the lens 8 with the desired magnification.

Next, the means 25 is positioned in horizontal position by extending the air cylinder 27, and then, the photosensitive material 48 and an overlaying mask (not shown) are positioned on the photosensitive material holder 39 by using the register pins 43. The photosensitive material is retained on the photosensitive material holder 39 by actuating a suction means (not shown) which sucks the suction grooves 42. Then, a signature or nigger head 2 and register marks 3 are printed on the photosensitive material 48 by lighting the flash lamp 22.

Then, the overlaying mask is released from the photosensitive material 48, and the means 25 is positioned into the vertical position by retracting the air cylinder 27. Then, the operation is carried out according to the selected mode, i.e. the drive motors $M_2$ and $M_3$ are automatically driven to move the photosensitive material holder 39 to the desired position of the photosensitive material 48, such that the position corresponding to the exposure number I of the paper 1 shown in FIG. 1 may be adjusted to be on the light axis X-Y, and the exposure number I of the surface of the paper 1 is displayed on the display of the operational board 44 in the same time.

In the same time, when the manuscript 12 is of A-4 size, the solenoids $S_9$ and $S_{10}$ are actuated to project the register pins $P_9$ and $P_{10}$ beyond the manuscript holder 10, and the manuscript 12 is positioned in the center of the manuscript holder 10 by means of the register pins $P_9$ and $P_{10}$ while the suction grooves 13 are sucked to hold the manuscript 12 tightly.

On this occasion, the paper number of the manuscript 12 and the exposure order are displayed on the display of the operational board 44. Since the manuscript 12 is positioned by means of the register pins $P_9$ and $P_{10}$ with the result that its positioning direction is determined, the manuscript 12 can be mounted to the manuscript holder 10 without any mistake.

Figure 1:
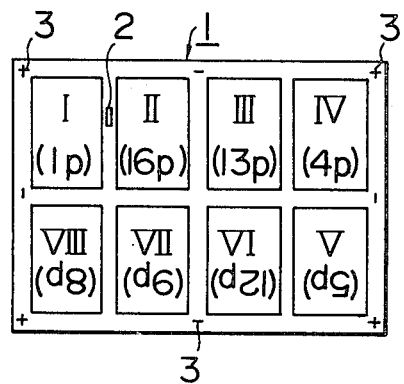
FIG. 1 shows a surface of a printed paper.

Then, the light sources 20 are illuminated and the exposure is carried out by operating the operational board 44, thereby finishing the exposure of the first page in the position corresponding to the exposure number I of the paper 1 of FIG. 1. Then, the photosensitive material holder 39 is automatically moved to the position corresponding to the exposure number II according to the selected mode, and the exposure number II and the page number 16 are displayed on the display of the operational board 44 in the same time. The exposure operation is carried out automatically in the same manner as described above.

Then, when the exposure number becomes V, the CPU 45 gives the instructions to deactivate the solenoids $S_9$ and $S_{10}$ and to activate the solenoids $S_{11}$ and $S_{12}$, so that the register pins $P_9$ and $P_{10}$ may be retracted within the manuscript holder 10 and the register pins $P_{11}$ and $P_{12}$ may be projected beyond the same. Hence, the manuscript 12 can be positioned upsidedown on the manuscript holder 10 without any mistake. Other operations are performed in the same manner as described above, thereby finishing the printing of all manuscripts 12 on the surface of the paper 1. Then, the photosensitive material holder 39 is returned to the starting point automatically.

Figure 2:
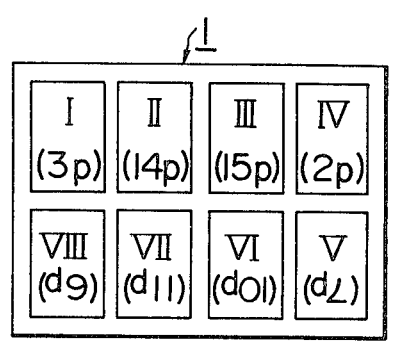
FIG. 2 shows a reverse surface of the printed paper of FIG. 1.

Next, the photosensitive material 48 is replaced with a new one, and the reverse surface of the paper 1 of FIG. 2 is printed in the same manner as described above.

It is readily understood from the above description that the manuscripts can be automatically printed one by one on a photosensitive material in the desired display positions according to the displayed indications on the display of the operational board, except that the manuscripts and positioned one be one onto the manuscript holder in the indicated exposure order by an operator, according to the present invention. Accordingly, there is no danger to occur any mistake.

Further, according to the present invention the manuscripts are processed one by one, and thus the photographing section is designed so compact and low-priced.

In this process camera, by replacing the plane mirror 9 with a roof mirror, a press plate print and a film photographing can be readily carried out without changing the light axis.

In the process camera of the present invention, the installation space required is less than a process camera of a horizontal type, and further the exchange of the manuscripts can be performed in the horizontal position and thus the operation is carried out quickly and easily.

Although the present invention has been described in some detail by way of illustration and example for purposes of clarity of understanding, it will, of course, be understood that various changes and modifications thereof may be made in the form, details, and arrangements of the parts without departing from the scope of the present invention.

What is claimed is:

1. A process camera for printing pictures of different sizes in the desired display positions on a photosensitive materials, comprising:
    (a) an object holder on which an object to be photographed is mounted and which includes a light for illuminating the object;
    (b) a photosensitive material holder on which a photosensitive material is mounted;
    (c) a lens holder for holding a lens which focuses the object onto the photosensitive material, wherein these three holders are aligned in series on and along a light axis of the lens, wherein the lens holder is positioned between the object holder and the photosensitive material holder, wherein the object holder is movable towards and away from the lens holder, and wherein the photosensitive material holder is movable in x and y directions perpendicular to the light axis; and (d) a plurality of register pins and respective drive means for positioning the objects of different sizes, which are mounted to the object holder so that each of the register pins may be independently projected through or beyond the object holder by the respective drive means.

2. A process camera as defined in claim 1, wherein certain register pins are projected by instructions of a controller wherein serial numbers, display positions, positioning directions and exposure orders of the objects are stored.

3. A process camera as defined in claims 1 or 2, wherein the serial numbers and the display positions of the objects to be exposed are displayed.

4. A process camera as defined in claim 3, wherein the object holder is arranged horizontally and the lens holder and the photosensitive material holder are arranged vertically, and wherein a plane mirror is provided above the object holder so that the light reflected by the object may be reflected perpendicularly to the lens.

* * * * *